US005771208A

United States Patent [19]

Iwase et al.

[11] Patent Number: 5,771,208

[45] Date of Patent: Jun. 23, 1998

[54] MEMORY FOR STORING MULTI-DATA

[75] Inventors: Yasuaki Iwase, Tenri; Yuichi Sato, Mie, both of Japan

[73] Assignee: Sharp Kabushiki Kaisha, Osaka, Japan

[21] Appl. No.: 804,089

[22] Filed: Feb. 20, 1997

[30] Foreign Application Priority Data

Feb. 27, 1996 [JP] Japan .................................... 8-039776

[51] Int. Cl.$^{6}$ .................................................... G11C 11/56

[52] U.S. Cl. ............................................ 365/168; 365/104

[58] Field of Search ............................... 365/168, 185.03, 365/103, 104

[56] References Cited

U.S. PATENT DOCUMENTS 5,394,355 2/1995 Uramoto et al. ........................ 365/104

OTHER PUBLICATIONS

S. Kouyama, "Superhigh–speed MOS Device" (1986) pp. 316–318.

*Primary Examiner*—David C. Nelms
*Assistant Examiner*—Michael T. Tran
*Attorney, Agent, or Firm*—Morrison & Foerster, LLP

[57] ABSTRACT

A semiconductor device which is capable of storing n-bits in a unit cell by providing said cell with a set of $2^n-1$ ($n \geqq 2$) word-lines and switching means connected or not connected to one of the word-lines and by reading data from a unit cell on the basis of an address designated by an activated word-line and a change of a signal in a bit-line according to the activated word-line.

1 Claim, 3 Drawing Sheets

MEMORY FOR STORING MULTI-DATA

BACKGROUND OF THE INVENTION

A construction of a unit cell of a conventional read-only semiconductor memory is composed of a gate electrode, a word-line, a memory cell transistor and a bit-line. A node between the gate electrode and the word-line has either of two states—connected and not connected. This is determined by data previously written in the semiconductor device during manufacture of the memory. The bit-line is set to a specified voltage other than the ground voltage before starting reading operation.

The operation of the unit cell of the conventional read-only semiconductor memory is as follows:

A case that the node is in the connected state is first described. When the word-line is activated, the gate electrode of the memory cell transistor is activated through the node. This causes the memory cell transistor to be ON, which causes the bit-line to drop to the ground potential.

A case that the node is in the not-connected state is now described. In this case, the memory cell transistor remains always in OFF state independent of activation of the word-line since the gate electrode is not connected to the word-line. In short, the bit-line remains at a given potential even when the word-line is activated.

As described above, the conventional read-only semiconductor memory stores information in such a manner that the node is connected or not connected to the word-line.

With the development of semiconductor technology achieved in these years, logic devices and memory devices become large-scaled by means of increasing the number of elements integrated on one chip. In order to reduce a cost of a chip, it is required to increase the number of elements accumulated on a specified area of the chip to achieve a higher functional chip or to reduce the area of a chip with the same functions maintained.

In the conventional read-only semiconductor memory above-mentioned, one-bit data is stored by connecting or not-connecting one word-line with one memory cell transistor. Therefore, one memory cell can store only one-bit data, with a result that a high level integration of elements can not be achieved.

SUMMARY OF THE INVENTION

The present invention relates to a semiconductor device and more particularly to a read-only semiconductor memory.

A semiconductor device according to the present invention is provided with a set of $2^n-1$ ($n \geqq 2$) word-lines corresponding to a unit cell of a memory cell, a gate electrode of a transistor of the unit cell, said electrode connected to one of the $2^n-1$ ($n \geqq 2$) word-lines or not-connected to any word-line, and a bit-line connected to a drain of the transistor of the unit cell when the word-line and the gate electrode are interconnected and not connected to the drain when the word-line and the gate electrode are not interconnected, and is capable of reading n-bit information from the unit cell according to an address corresponding to an activated word-line and a change of a signal in the bit-line.

PREFERRED EMBODIMENT OF THE INVENTION

Prior to explaining preferred embodiment of the present invention, prior art read-only semiconductor memory will be described below as reference for the present invention.

Figure 1:
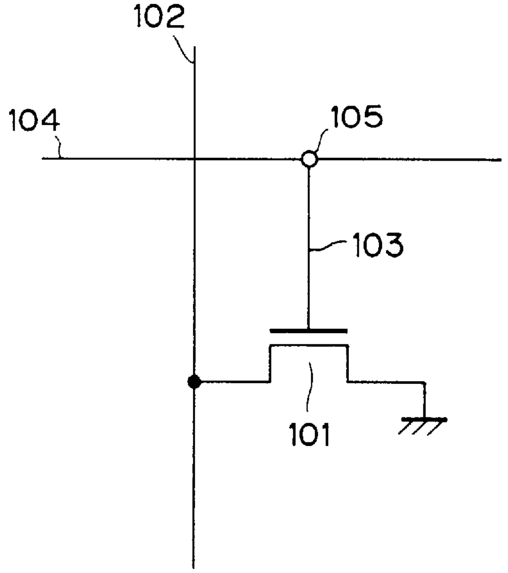
FIG. 1 shows a construction of a unit cell of a conventional read-only semiconductor memory.

FIG. 1 shows a construction of a unit cell of a conventional read-only semiconductor memory, which is composed of a gate electrode 103, a word-line 104, a memory cell transistor 101 and a bit-line 102. A node 105 between the gate electrode 103 and the word-line 104 has either of two states—connected and not connected. This is determined by data previously written in the semiconductor device during manufacture of the memory. The bit-line 102 is set to a specified voltage other than the ground voltage before starting reading operation.

The operation of the unit cell of the conventional read-only semiconductor memory is as follows:

A case that the node 105 is in the connected state is first described. When the word-line 104 is activated, the gate electrode 103 of the memory cell transistor 101 is activated through the node 105. This causes the memory cell transistor 101 to be ON, which causes the bit-line 102 to drop to the ground potential.

A case that the node 105 is in the not-connected state is now described. In this case, the memory cell transistor 101 remains always in OFF state independent of activation of the word-line 104 since the gate electrode 103 is not connected to the word-line 104. In short, the bit-line 102 remains at a given potential even when the word-line 104 is activated.

As described above, the conventional read-only semiconductor memory stores information in such a manner that the node 105 is connected or not connected to the word-line 104.

In the conventional read-only semiconductor memory above-mentioned, one-bit data is stored by connecting or not-connecting one word-line with one memory cell transistor. Therefore, one memory cell can store only one-bit data, with a result that a high level integration of elements can not be achieved.

Figure 2:
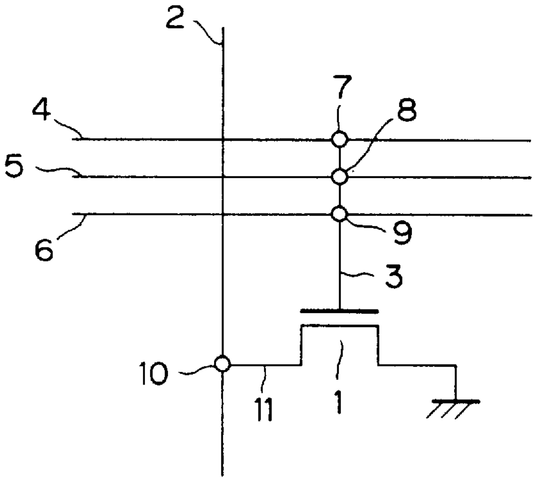
FIG. 2 is a view showing a construction of a unit cell of a semiconductor device which is an embodiment (in case of n=2) of the present invention.

An embodiment using an n-channel MOS field-effect transistor (hereinafter referred to as n-MOS FET) according to the present invention is shown in FIG. 2.

FIG. 2 shows a basic construction of a unit cell of a contact-hole programmable read-only semiconductor memory (in a case of n=2) according to the present invention. The unit cell is provided with a memory cell transistor 1, a bit-line 2, a gate electrode 3 of the memory cell transistor, three word-lines 4, 5 and 6. The gate electrode 3 is connected at one of nodes 7, 8 and 9 to one of word-lines 4, 5 and 6 or has no connection with any word-line. The bit-line 2 is connected to a drain region 11 through the node 10 on the condition that any one of the nodes 7, 8 and 9 is connected to the gate electrode 3. The node 10 does not connect the bit-line 2 to the drain region 11 if no connection is made at the nodes 7, 8 and 9.

The operation of this read-only semiconductor memory is as follows:

The potential of the bit-line 2 is set at a specified level other than the ground potential before read operation. This embodiment has an output 0 when the bit-line potential drops to the earth level and an output 1 when the bit-line potential is restored to the specified level.

A first address (hereinafter referred to as ADR0) is read as follows:

In this case, the word-lines 4 and 6 are activated. Four different cases of interconnections between three word-lines 4, 5 and 6 and the gate electrode 3, and interconnection between the bit-line 2 and the node 10 will be described respectively.

Figure 3:
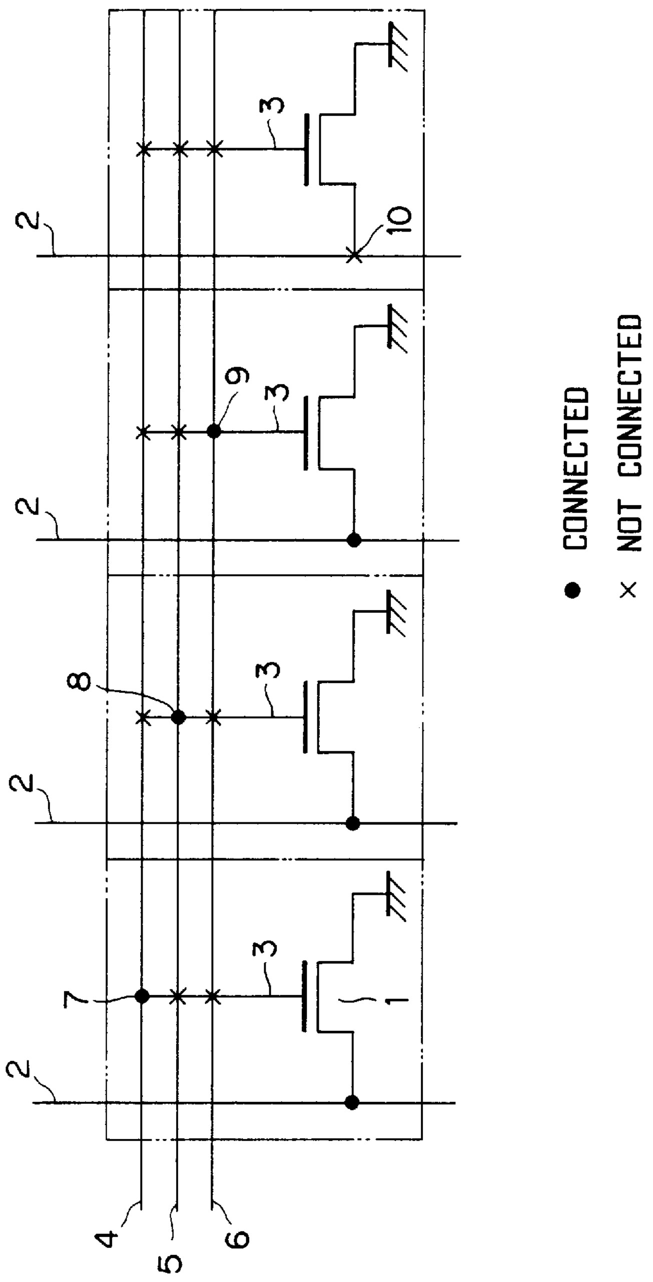
FIG. 3 is a view showing a construction of a unit cell corresponding to stored data in a semiconductor device according to the present invention.

FIG. 3 is illustrative of the construction of the semiconductor memory with different node connections (a), (b), (c) and (d).

With the word-line 4 connected to the gate electrode 3 at the node 7 (FIG. 3(*a*)), the memory cell transistor 1 becomes ON and, therefore, the potential of the bit-line 2 through the memory cell transistor 1 is decreased to the ground level. Consequently, data '0' is outputted.

With the word-line 5 connected to the gate electrode 3 at the node 8 (FIG. 3(*b*)), the memory cell transistor 1 remains OFF and, therefore, the potential of the bit-line 2 does not change and remains at the specified level. Consequently, output data is '1' in this case.

With the word-line 6 connected to the gate electrode 3 at the node 9 (FIG. 3(*c*)), the memory cell transistor 1 becomes ON and, therefore, the potential of the bit-line 2 through the memory cell transistor 1 is decreased to the ground level. Consequently, data '0' is outputted.

With the word-lines 4, 5 and 6 being not connected to the gate electrode 3 (FIG. 3(*d*)), the gate electrode of the memory cell transistor becomes into so-called floating state and, therefore, the node 10 is not connected. In this case, the memory cell transistor is disconnected from the bit-line and, therefore, data '1' is outputted.

A second address (hereinafter referred to as ADR1) is read from the same memory cell as follow: The word-lines 5 and 6 are activated to read ADR1.

With the word-line 4 connected to the gate electrode 3 at the node 7 (FIG. 3(*a*)), the memory cell transistor 1 remains OFF and, therefore, the potential of the bit-line 2 does not change and remains at the specified level. Consequently, output data is '1' in this case.

With the word-line 5 connected to the gate electrode 3 at the node 8 (FIG. 3(*b*)), the memory cell transistor 1 becomes ON and, therefore, the potential of the bit-line 2 through the memory cell transistor 1 is decreased to the ground level. Consequently, data '0' is outputted.

With the word-line 6 connected to the gate electrode 3 at the node 9 (FIG. 3(*c*)), the memory cell transistor 1 becomes ON and, therefore, the potential of the bit-line 2 through the memory cell transistor 1 is decreased to the ground level. Consequently, data '0' is outputted.

With the word-lines 4, 5 and 6 being not connected to the gate electrode 3 (FIG. 3(*d*)), the gate electrode of the memory cell transistor becomes into so-called floating state and, therefore, the node 10 is not connected. In this case, the memory cell transistor is disconnected from the bit-line 2 and, therefore, data '1' is outputted.

Table 1 shows data values read from the addresses depending to the node connections.

TABLE 1

| | Word-Lines activated: | |
|---|---|---|
| | 4 and 6 ADR0 | 5 and 6 ADR1 |
| Node 7 connected | 0 | 1 |
| Node 8 connected | 1 | 0 |
| Node 9 connected | 0 | 0 |
| No connection | 1 | 1 |

Table 1 indicates that 4 values can be read from one memory cell transistor depending upon the node connections and addresses. In short, the read-only semiconductor memory according Lo this embodiment of the present invention is capable of storing two-bit information in a memory cell transistor.

Figure 4:
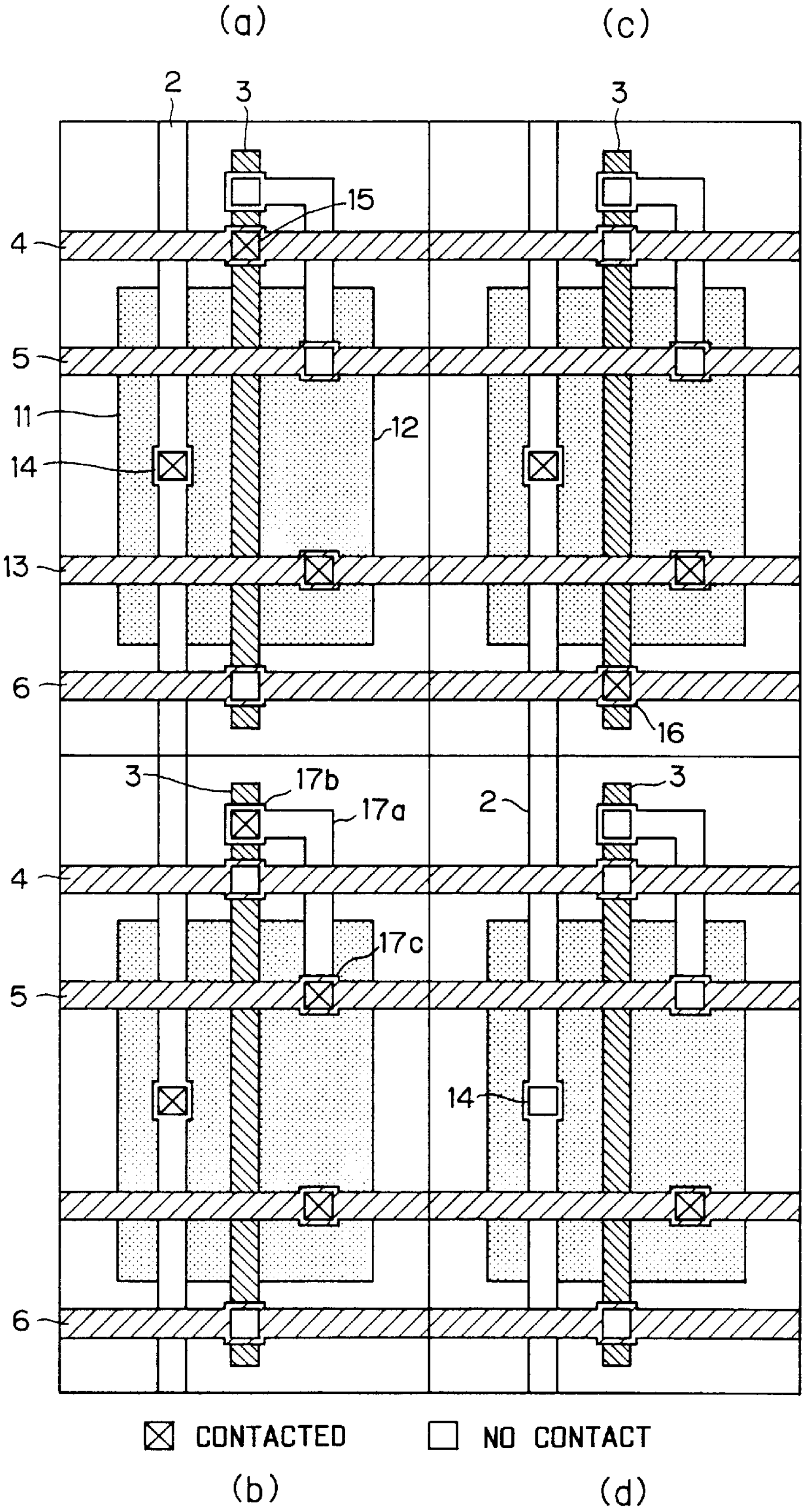
FIG. 4 shows a layout of the semiconductor device according to the present invention.

FIG. 4 shows an exemplified lay-out of the read-only semiconductor memory according to the present invention. In FIG. 4, there is arranged four kinds of memory cells corresponding to those shown in FIGS. 3(*a*) to 3(*d*). One memory cell comprises a bit-line 2, a gate electrode 3, word-lines 4, 5 and 6, a drain region 11, a source region 12 and an earth wire 13. In this example, wiring is conducted in three layers: the bit-line 2, the gate electrode 3 and the word-lines 4, 5 and 6 and the earth wire 13. The bit-line 2 and the drain region 11 are connected to each other through a contact 14.

The memory cell of FIG. 4(*a*) has the contact 15 connecting the word-line 4 to the gate electrode 3 and therefore corresponds to the memory cell of FIG. 3(*a*). Accordingly, data read from the address ADR0 by activating the word-lines 4 and 6 is 0 and data read from the address ADR1 by activating the word-lines 5 and 6 is 1. Readable data is described hereinafter as (0, 1).

The memory cell of FIG. 4(*b*) has a wiring 17*a* and contacts 17*b* and 17*c* between the word-lines 5 and the gate electrode 3 and therefore corresponds to that of FIG. 3(*b*). Namely, data(0,1) is written therein.

The memory cell of FIG. 4(*c*) has a contact 16 between the word-lines 6 and the gate electrode 3 and therefore corresponds to that of FIG. 3(*c*). Namely, data (0, 0) is written therein.

In each of the above-mentioned three cases, the contact 14 is provided for connecting the bit-line 2 with the drain region 11. In the memory cell of FIG. 4(*d*), the gate electrode 3 is not connected with any of the word-lines 4, 5 and 6 and lacks contact 14 connecting the bit-line 2 with the drain region 11. Therefore, this memory cell corresponds to that of FIG. 3(*d*) and has data (1, 1) written therein. Thus, information to be written is determined optionally by selecting connections between the word-line 5 and the gate electrode 3 and between the bit-line 2 and the drain region 11. Although the shown embodiment describes an n-MOS FET having a N+ diffusion layer, it can be applied to other transistor such as p-MOS FET.

The read-only semiconductor memory according to the present invention requires $2^n-1$ ($n \geqq 2$) word-lines for n ($n \geqq 2$) addresses whilst the conventional one requires one word-line for one address. In short, the present invention can reduce the number of memory cell transistors to 1/n ($n \geqq 2$) but increases a relative area occupied by the word-lines by a factor of $(2^n-1)/n$ ($n \geqq 2$) as compared with the conventional device. Accordingly, the read-only semiconductor memory according to the present invention would be rather applied to a gate array including memory cells with a small density of transistors than applied to a large capacity read-only semiconductor memory device with a high density of memory cell transistor. This may avoid a problem occurring from increasing a wiring area required for placing the increased number of word-lines.

Although the described embodiment relates to a read-only semiconductor memory when n=2, it may be similarly realized when n is 3 and more. For example, one address is read by simultaneously activating two word-lines when n=2 whilst one address is read by simultaneously activating four word-lines when n=3.

As described above, the semiconductor device according to the present invention is capable of storing n-bit information ($n \geqq 2$) in a memory cell since each memory cell can be commonly used by n ($n \geqq 2$) addresses. Accordingly, the present invention can provide a read-only semiconductor memory having a higher integration.

We claim:

1. A semiconductor device which is provided with a set of $2^n-1$ ($n \geqq 2$) word-lines corresponding to a unit cell of a memory cell, a gate electrode of a transistor of the unit cell, said electrode connected to one of the $2^n-1$ ($n \geqq 2$) word-lines or not-connected to any word-line, and a bit-line connected to a drain of the transistor of the unit cell when the word-line and the gate electrode are interconnected or not connected to the drain when the word-line and the gate electrode are not interconnected, and which is capable of reading n-bit information from the unit cell according to an address corresponding to a word-line being made active and a change of a signal in the bit-line.

* * * * *